(12) United States Patent
Kelekar (10) Patent No.: US 9,038,650 B2
(45) Date of Patent: May 26, 2015

(54) CALIBRATION OF A CHEMICAL DISPENSE SYSTEM

(71) Applicant: Intermolecular, Inc., San Jose, CA (US)

(72) Inventor: Rajesh Kelekar, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/030,968

(22) Filed: Sep. 18, 2013

(65) Prior Publication Data

US 2014/0014681 A1    Jan. 16, 2014

Related U.S. Application Data

(62) Division of application No. 12/239,555, filed on Sep. 26, 2008, now Pat. No. 8,561,627.

(51) Int. Cl.
*B67D 7/08* (2010.01)
*H01L 21/67* (2006.01)
*F04B 49/06* (2006.01)

(52) U.S. Cl.
CPC .......... *B67D 7/085* (2013.01); *H01L 21/67017* (2013.01); *F04B 49/065* (2013.01)

(58) Field of Classification Search
CPC . G05D 7/0635; G05D 7/0641; G05D 7/0647; G05D 7/0652; G05D 7/0658; G05D 7/0664; B67D 7/085; H01L 21/67017; F04B 49/065
USPC ...................................................... 137/12, 14
See application file for complete search history.

(56) References Cited

U.S. PATENT DOCUMENTS

| | | | | |
|---|---|---|---|---|
| 3,462,300 | A * | 8/1969 | Hocutt | 134/33 |
| 3,880,178 | A * | 4/1975 | Panissidi | 137/14 |
| 4,718,443 | A * | 1/1988 | Adney et al. | 137/8 |
| 5,597,949 | A * | 1/1997 | Kalotay | 73/54.01 |
| 5,636,653 | A * | 6/1997 | Titus | 137/14 |
| 5,720,814 | A * | 2/1998 | Takagi et al. | 118/319 |
| 5,772,764 | A * | 6/1998 | Akimoto | 118/319 |
| 6,168,048 | B1 * | 1/2001 | Xu et al. | 222/1 |
| 6,283,138 | B1 * | 9/2001 | Friend et al. | 137/14 |
| 6,293,849 | B1 * | 9/2001 | Kawashima | 451/41 |
| 6,363,959 | B1 * | 4/2002 | Ollivier | 137/14 |
| 6,422,256 | B1 * | 7/2002 | Balazy et al. | 137/12 |
| 6,471,487 | B2 * | 10/2002 | Keilty et al. | 417/26 |
| 6,478,040 | B1 * | 11/2002 | Kikuchi et al. | 137/1 |
| 6,527,862 | B2 * | 3/2003 | McLoughlin et al. | 118/313 |
| 6,554,579 | B2 * | 4/2003 | Martin et al. | 417/53 |
| 6,575,264 | B2 * | 6/2003 | Spadafora | 180/422 |
| 6,592,825 | B2 * | 7/2003 | Pelc et al. | 422/521 |
| 6,742,993 | B2 * | 6/2004 | Savard et al. | 417/53 |
| 2006/0054219 | A1 * | 3/2006 | Sund et al. | 137/487.5 |
| 2006/0152995 | A1 * | 7/2006 | Kreutzer | 366/8 |
| 2007/0128047 | A1 * | 6/2007 | Gonnella et al. | 417/2 |
| 2007/0204907 | A1 * | 9/2007 | Strang | 137/2 |
| 2009/0229688 | A1 * | 9/2009 | Shirai | 137/565.11 |
| 2009/0250000 | A1 * | 10/2009 | Kobayashi et al. | 118/50 |
| 2009/0320930 | A1 * | 12/2009 | Zeng et al. | 137/14 |

* cited by examiner

*Primary Examiner* — William McCalister (57) ABSTRACT

In one implementation, a method for providing a fluid at a target pressure may include providing a fluid at a velocity to a supply line through a dispenser, measuring a pressure of the fluid flowing through the supply line, comparing the measured pressure with the target pressure, and adjusting the velocity based on the results of the comparison.

13 Claims, 7 Drawing Sheets

CALIBRATION OF A CHEMICAL DISPENSE SYSTEM

CROSS-REFERENCE TO RELATED APPLICATIONS

This application is a divisional claiming priority to U.S. patent application Ser. No. 12/239,555, filed 26 Sep. 2008, which is entirely incorporated by reference herein for all purposes.

GOVERNMENT RIGHTS IN THIS INVENTION

This invention was made with U.S. government support under contract number H94003-07-C-0712. The U.S. government has certain rights in this invention.

BACKGROUND

1. Field of the Invention

Implementations of various technologies described herein generally relate to substrate processing.

2. Description of the Related Art

The following descriptions and examples do not constitute an admission as prior art by virtue of their inclusion within this section.

To achieve the desired performance enhancement for each successive generation of silicon integrated circuits (ICs), semiconductor manufacturing has become increasingly reliant on new materials and their integration into advanced process sequences. Unfortunately, typical semiconductor manufacturing equipment is not well suited for materials exploration and integration. Issues impacting the use of typical semiconductor manufacturing equipment include difficulty in changing process materials and chemicals rapidly, limited ability to integrate and sequence multiple materials or chemicals in a single reactor or process chamber, high equipment cost, large sample size (e.g. 300 mm wafers) and inflexible process/reactor configurations. To complement traditional manufacturing tools, a need has arisen for process equipment that facilitates fast testing of new materials and materials processing sequences over a wide range of process conditions.

BRIEF DESCRIPTION OF THE DRAWINGS

Implementations of various technologies will hereafter be described with reference to the accompanying drawings. It should be understood, however, that the accompanying drawings illustrate only the various implementations described herein and are not meant to limit the scope of various technologies described herein.

DETAILED DESCRIPTION

The following paragraphs provide a brief general description of one or more implementations of various technologies and techniques directed at calibrating a fluid flow rate with respect to a pressure in a chemical dispense system that may be part of a combinatorial processing tool. In one implementation, the fluid may be a liquid chemical used in the combinatorial processing tool. A dispenser, such as a syringe, containing the fluid may be coupled to a supply line of the chemical dispense system. The supply line may be coupled to a supply manifold having a plurality of valves. Each valve may be coupled to a dispense path, which may be used to provide the fluid a path to one or more vessels and/or one or more reactors within the combinatorial processing tool. A pressure indicator may be coupled to the supply line to measure the pressure available at the supply line.

A controller may be coupled to a motor, which may be configured to push a plunger of the dispenser. In one implementation, the motor may push the plunger at a constant velocity or at a velocity with a constant acceleration such that the fluid contained within the dispenser may be provided to the supply line with a constant flow rate or a flow rate with a constant acceleration. The resulting pressure at the supply line may then be measured by the pressure indicator. Given the volume of fluid dispensed into the supply line by the dispenser and the time elapsed in providing the volume of fluid, the controller may determine the flow rate of the fluid provided to the supply line. The flow rate of the fluid may then be recorded along with a corresponding pressure value obtained from the pressure indicator. The resulting fluid flow rate and pressure data may then be used as calibration data that may correlate a fluid flow rate to its pressure value.

In another implementation, the controller may use the calibration data that correlates a fluid's flow rate to its pressure value to provide a specified volume of a fluid into a destination vessel. The controller may first receive inputs from a user specifying a target pressure and a specific volume of the fluid to be provided to the destination vessel. The controller may then determine the fluid flow rate that corresponds with the fluid and the specified target pressure from the calibration data of the chemical dispensing system. Using the fluid flow rate, the controller may calculate an amount of time required to fill the destination vessel with the specified volume of the fluid at the target pressure. The controller may then allow the fluid to flow to the destination vessel at the target pressure for the calculated amount of time. The resulting volume of fluid in the destination vessel may be equal to the volume originally specified by the user.

In yet another implementation, the controller may also be used to provide a fluid to the supply line at a specified pressure. After receiving a specific pressure value from a user, the controller may send a command to the motor to push the plunger at a constant velocity. A pressure indicator may be used to measure the corresponding pressure of the fluid being provided into the supply line. The controller may receive the corresponding pressure value from the pressure indicator, and it may compare this received pressure value with the pressure value specified by the user. Based on the results of the comparison, the controller may increase or decrease the velocity in which the motor pushes the plunger in the dispenser in order to provide the fluid at the user's specified pressure value.

The various implementations in calibrating a chemical dispense system with a dispenser may have advantages in that they may ensure that a chemical may be delivered to one or more vessels or reactors in a combinatorial process tool at a specified flow rate, volume, or pressure. The ability to specify the flow rate, volume, or pressure may increase the accuracy in which a chemical reaction takes place for a combinatorial process. Furthermore, the use of a dispenser may eliminate the need for a flow meter, which may consequently reduce the complexity and costs while increasing the accuracy of the combinatorial processing tool. The dispenser may be used to accurately dispense a small amount of a chemical while measuring the flow rate of the chemical which may also be useful for combinatorial processing. The dispenser may also be used to determine the flow rate properties or calibration data of the chemical dispense system and its various dispense paths. The calibration data may improve the consistency and repeatability of the combinatorial process by accurately measuring the flow rate for each dispense path connected to a vessel or a reactor.

One or more implementations of various techniques for calibrating a chemical dispense system with a dispenser will now be described in more detail with reference to FIGS. 1-5 in the following paragraphs.

The discussion below is directed to certain implementations. It is to be understood that the discussion below is only for the purpose of enabling a person with ordinary skill in the art to make and use any subject matter defined now or later by the patent "claims" found in any issued patent herein.

Combinatorial processing may include any processing, including semiconductor processing, which varies the processing conditions across one or more substrates. As used herein, a substrate may be, for example, a semiconductor wafer, a portion of a semiconductor wafer, solar photovoltaic circuitry, or other semiconductor substrate. The term "substrate" includes a coupon, which is a diced portion of a wafer, or any other device on which semiconductor processes are performed. The coupon or substrate may optionally contain one die, multiple dice (connected or not through the scribe), or portion of die with useable test structures. In some implementations, multiple coupons, or die can be diced from a single wafer and processed combinatorially.

Combinatorial processing is performed by varying processing conditions across multiple substrates, multiple regions of a single substrate, or a combination of the two. Processing conditions may include, for example, chemical formulation, fluid flow rates, temperatures, reaction times, concentrations, agitation or stirring, and the like. For example, a first region of a substrate may be processed using a first process condition (e.g., applying a chemical at a first temperature) and a second region of the substrate may be processed using a second process condition (e.g., applying the chemical at a second temperature). The results (e.g., the measured characteristics of the processed regions) are evaluated, and none, one, or both of the process conditions may be selected as suitable candidates for larger scale processing (e.g., further combinatorial processing or deposition on a full wafer).

Several combinatorial processing tools can be used. One type of tool may include a reactor block that has several openings (e.g., cylindrical openings) that define individual reactors on one or more substrates. Each of the openings may further include a sleeve that creates a seal with the substrate to contain processing fluids or chemicals within a single reactor (i.e., "site-isolated"). For example, a reactor block may include 28 openings that define 28 regions on a substrate. Each of the 28 regions can be processed using varying process conditions, or multiple regions can have the same processing conditions. For example, seven sets of processing conditions can be performed across four regions each. Each region can then be characterized using various techniques (e.g., electrical test, microscopy), and useful or beneficial techniques and/or conditions can be selected.

Other combinatorial processing may be performed in a manner that is not site isolated. For example, a wafer can be divided into many small coupons, each of which can be processed using different conditions. Using another example, a wafer can be processed using a gradient approach, where the processing varies over the substrate. These techniques may also be used in combination with site-isolated combinatorial techniques.

Figure 1A:
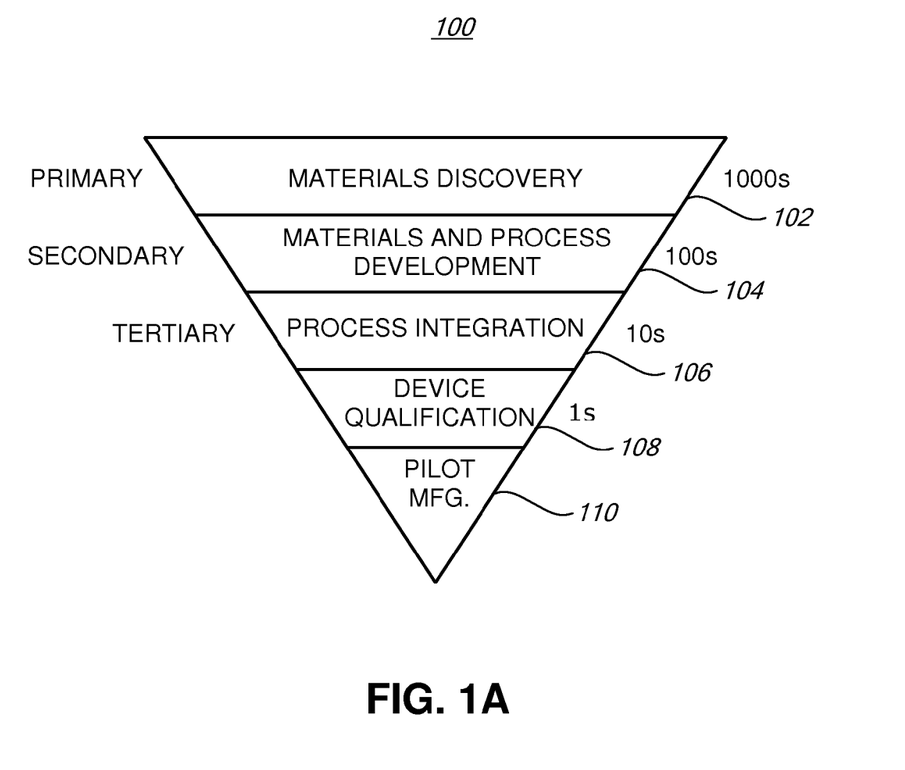
FIG. 1A illustrates a schematic diagram for implementing combinatorial processing in connection with implementations of various technologies described herein.

FIG. 1A illustrates a schematic diagram 100 for implementing combinatorial processing in connection with implementations of one or more technologies described herein. The schematic diagram 100 illustrates that the relative number of combinatorial processes that run with a group of substrates decreases as certain materials and/or processes are selected. Generally, combinatorial processing includes performing a large number of processes during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing wafers into coupons and depositing materials using varied processes. The materials are then evaluated, and promising candidates are advanced to the secondary screen, i.e., materials and process development stage 104. Evaluation of the materials may be performed using metrology tools such as electronic testers and imaging tools, e.g., microscopes.

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification stage 108. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to the manufacturing stage 110.

The schematic diagram 100 is an example of various techniques that may be used to evaluate and select materials and processes for the development of semiconductor devices. The descriptions of primary, secondary, etc. screening and the various stages 102-110 are arbitrary and the stages may overlap, occur out of sequence, be described and be performed in many other ways.

Figure 1B:
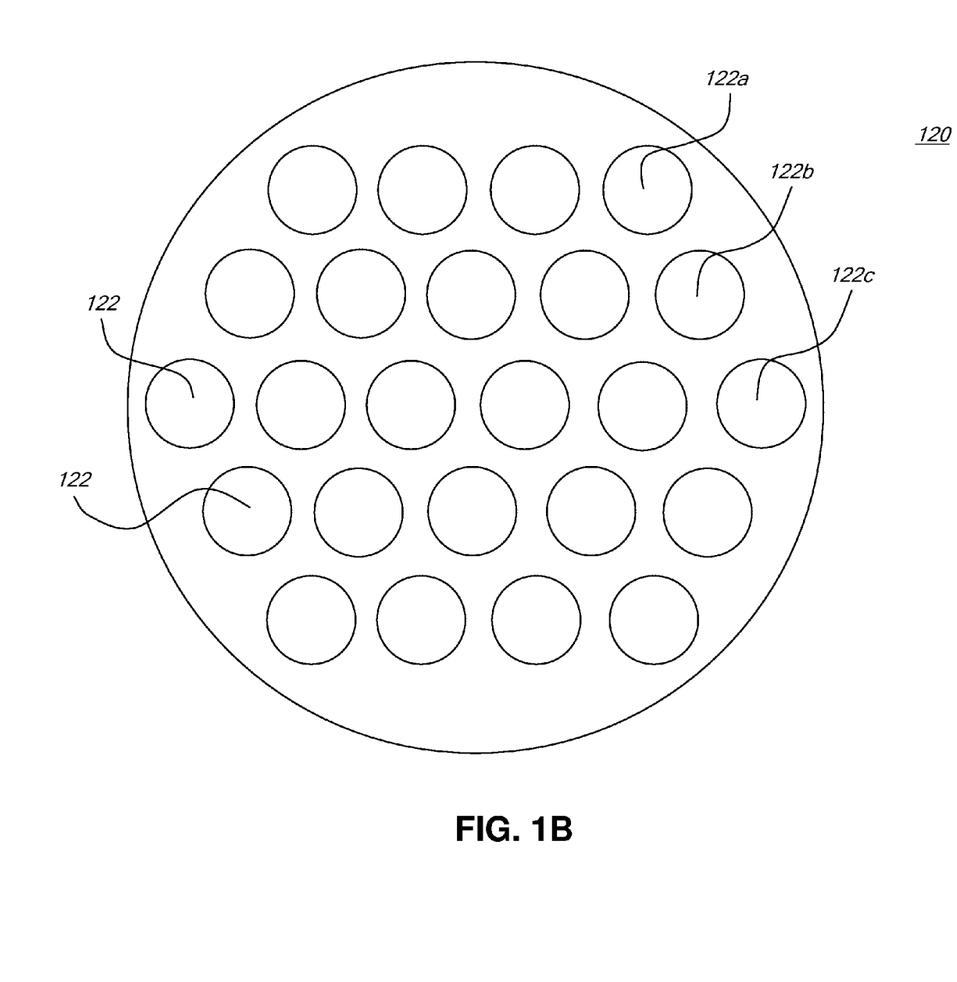
FIG. 1B illustrates an exemplary substrate containing multiple regions for combinatorial processing according to implementations of various technologies described herein.

FIG. 1B illustrates a substrate 120 having multiple regions for combinatorial processing in accordance with various techniques described herein. Substrate 120 includes several regions 122 on which semiconductor processes can be performed. For example, the regions 122a, 122b, and 122c may each have an electroless layer deposited on them. The region 122a may use a first chemical formulation, the region 122b may use a second chemical formulation, and the region 122c may use a third chemical formulation. The resulting layers can be compared to determine the relative efficacy of each of the formulations. None, one, or more of the formulations can then be selected to use with further combinatorial processing or larger scale processing (e.g., manufacturing). Any process variable (e.g., time, composition, temperature) or process sequencing can be varied using combinatorial processing.

As discussed above, each of the regions 122 may or may not be site isolated. Site isolation refers to a condition where the regions 122 can be processed individually and independently without interference from neighboring regions. For example, one or more of the regions 122 may include a sleeve having an end that forms a fluid seal with the substrate 120. The sleeve is configured to contain processing fluids (e.g., chemicals), and is made from a material (e.g. polytetrafluoroethylene (PTFE)) that does not react with the processing chemicals used. The chemicals do not leak out of the region into which they were dispensed, and each region 122 can be processed and evaluated individually.

Figure 2:
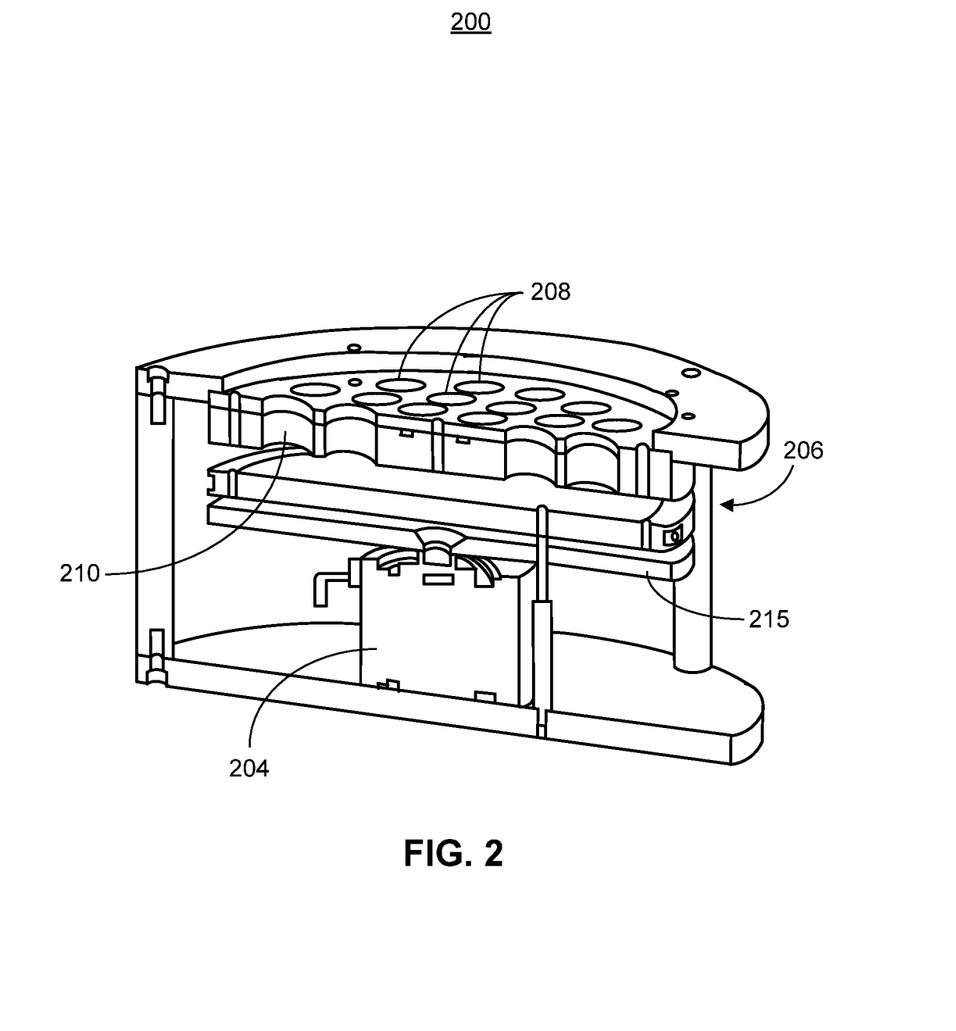
FIG. 2 illustrates a combinatorial processing tool in which various technologies may be incorporated and used in accordance with various techniques described herein.

Each of the regions 122 may be processed using a cell of a combinatorial processing tool, as described in FIG. 2. The tool is calibrated so that processing in each of the regions 122 is consistent and comparable. Using techniques described herein, pressure within the combinatorial processing tool may be monitored and the pressure supplied to the chemical supply vessel or bottle can be adjusted so that the flow rate in the flow cells stays consistent and calibrated. With these techniques, processed regions across one or multiple substrates may show reliable results that can be compared and characterized when performing combinatorial processing. For example, some of the implementations described herein can help provide consistent fluid delivery across multiple regions of a substrate. These embodiments can improve combinatorial processing by improving repeatability and comparability of certain processing techniques.

Combinatorial Processing Tool

FIG. 2 illustrates a combinatorial processing tool 200 in which one or more implementations of various technologies described herein may be incorporated and used. Although various implementations described herein are with reference to the combinatorial processing tool 200, it should be understood that some implementations may use other types of combinatorial processing tool, such as a combinatorial processing tool with an open deck or any other type of combinatorial processing tool that uses stirring.

The combinatorial processing tool 200 may include a reactor block 206 having a plurality of reactor cells 208. The reactor block 206 is configured to mate with a stage or chuck 204, which is configured to secure a substrate 215. The combinatorial processing tool 200 may also include a floating reactor sleeve or wall 210, which may be configured to float or be dynamically positionable in each reactor cell 208.

Figure 3:
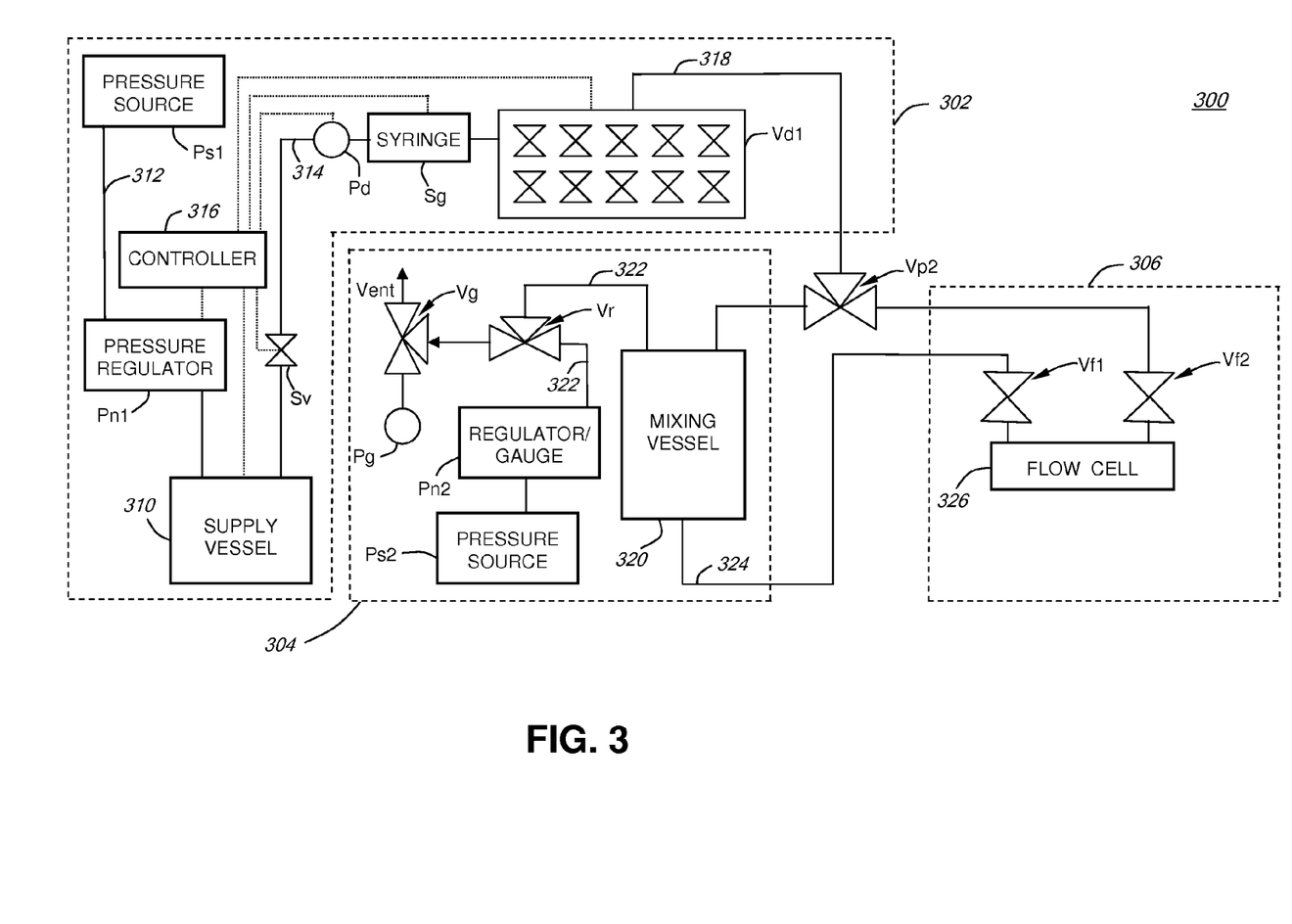
FIG. 3 illustrates a schematic diagram of a combinatorial processing tool according to implementations of various techniques described herein.

FIG. 3 illustrates a schematic diagram of a combinatorial processing tool 300 according to implementations of one or more technologies described herein. The combinatorial processing tool 300 illustrated in FIG. 3 may be a wet processing tool and may be a portion of a larger combinatorial processing tool. Portions of the combinatorial processing tool 300 may be replicated several times within a larger combinatorial processing tool such that a larger number of variations in substrate processing conditions may be achieved.

The combinatorial processing tool 300 illustrated in FIG. 3 may be divided into three parts. A chemical supply portion 302 may supply chemicals to a chemical mixing portion 304 and a site isolated reactor portion 306. The chemical mixing portion 304 may be used for mixing various chemicals, e.g., liquid chemicals, into solutions which may be applied to various locations on a substrate in the reactor portion 306. In one implementation, the chemical mixing portion 304 may be removed from the combinatorial processing tool 300. The reactor portion 306 may contain a site isolated reactor and may apply the solutions to the substrate or portions of the substrate and may subject the substrate or portions thereof to various processing conditions. The reactor portion 306 may be coupled to a waste portion 308 of the combinatorial processing tool 300. The waste portion 308 may be used to capture waste chemicals which were not used during substrate processing.

The supply portion 302 of the combinatorial processing tool 300 may include a supply vessel 310 containing a liquid chemical. The chemical may be applied to the substrate or may be mixed with another chemical to form a solution which is to be applied to the substrate. As illustrated in FIG. 3, a pressure source Ps1 and a pressure regulator Pn1 may be coupled to the supply vessel 310 via a pressure supply line 312. Together the pressure source Ps1 and the pressure regulator Pn1 may provide a pressurized gas, such as Nitrogen, at a regulated pressure to the supply vessel 310 via the pressure supply line 312. In this manner, the pressurized gas may be used to push the liquid chemical out of the supply vessel 310 and into a supply line 314 connecting the supply vessel 310 to a supply manifold Vd1.

A shutoff valve Sv, a pressure indicator Pd, and a dispenser, such as syringe Sg, may be coupled to the supply line 314. The syringe Sg may have a barrel to store the liquid chemical and a plunger to pull or push the liquid chemical into or out of its barrel. The pressure indicator Pd may be used to monitor the pressure within the supply line 314, and the shutoff valve Sv may be used to provide or deny access between the supply line 314 and the supply vessel 310.

The supply manifold Vd1 may contain a plurality of two-way and/or multi way valves connecting the supply vessel 310 to a plurality of mixing cells/vessels within the combinatorial processing tool 300. Furthermore, in lieu of a single supply vessel 310, a plurality of supply vessels containing various chemicals may be coupled to the supply manifold Vd1 such that the supply manifold Vd1 may supply various chemicals to multiple mixing portions or multiple site isolated reactor portions of the combinatorial processing tool 300. Additionally, in lieu of a single supply manifold Vd1, a plurality of supply manifolds Vd1 may be present in the combinatorial processing tool 300. Together the plurality of supply vessels, valves, and supply manifolds may enable the supply of various chemicals and chemical mixtures to the mixing portion 304 and the site isolated reactor portion 306 of the combinatorial processing tool 300.

The supply line 314 may couple the supply vessel 310 to the supply manifold Vd1 via one or more valves within the supply manifold Vd1. In this manner, the supply manifold Vd1 may control the flow of chemicals from the supply vessel 310 to the mixing portion 304 or the reactor portion 306 of the combinatorial processing tool 300.

The output of the valve in the supply manifold Vd1 may be coupled via a dispense path 318 to a valve Vp2. Each valve in the supply manifold Vd1 may be coupled to a different dispense path 318. The dispense path 318 may include one of multiple lines that may connect to the valve Vp2. Each dispense path 318 may be of a different length or made up of different properties which may result in different resistances in each path. The valve Vp2 may be a multi-way valve which controls the flow of fluids/chemicals from the supply manifold Vd1 into either the mixing portion 304, site-isolated reactor portion 306, or both. In one implementation, the combinatorial processing tool 300 may not have the supply manifold Vd1 coupled to the supply vessel 310; instead, the supply vessel 310 may be coupled directly to the dispense path 318.

The controller 316 may include a central processing unit (CPU), a system memory and a system bus that couples various system components including the system memory to the CPU. The system memory may include a read only memory (ROM) and a random access memory (RAM). A basic input/output system (BIOS) containing the basic routines that help transfer information between elements within the controller 316, such as during start-up, may be stored in the ROM. A number of program modules may be stored on the ROM or RAM, including an operating system and one or more application programs, which may carry out the tasks described later in FIGS. 4-6. The controller 316 may be configured to send and receive signals from other devices to perform some or all of the tasks described herein.

The controller 316 may be coupled to certain components in the supply portion 302 to control the calibration process, such as the pressure regulator Pn1, pressure indicator Pd, shutoff valve Sv, and each of the valves in the supply manifold Vd1. The controller 316 may provide the pressure regulator Pn1 a predetermined pressure to supply the supply vessel 310 based on an input of a user. The pressure indicator Pd may indicate to the controller 216 the pressure value of the supply line 314. The controller 316 may also control the opening and closing of the each valve, including the shutoff valve Sv and the valves within the supply manifold Vd1.

The controller 316 may also be coupled to a motor attached to the plunger of the syringe Sg. The controller 316 may send a command to the motor to push or pull the plunger such that the fluid may be provided to or drawn from the supply line 314. In one implementation, the motor may be a step motor such that the motor turns in equal, discrete steps, and the controller 316 may control the direction and the number of steps in which the motor may take.

The mixing portion 304 of the combinatorial processing tool 200 may be configured to facilitate thorough solution mixing of chemicals provided by supply portions. In order to form a solution, a plurality of chemicals may flow from the supply portion 302, e.g., the supply vessel 310, into different mixing vessels in the mixing portion 304. The mixing vessel 320 may then mix the chemicals to form solutions. The mixing portion 304 may also provide accurate temperature and pH control of a solution being mixed in the mixing portion 304.

A pressure source Ps2 and a pressure regulator Pn2 may be coupled to the mixing vessel 320 via a valve Vr and a supply line 322. Together the pressure source Ps2 and the pressure regulator Pn2 may provide a pressurized gas, e.g., Nitrogen, at a regulated pressure to the mixing vessel 320 via the valve Vr and the supply line 322. An outlet of the valve Vr may be coupled to another valve Vg to vent pressure within the supply line 322. The pressure in the supply line 322 may be measured by a pressure transducer Pg.

The pressurized gas provided by the pressure source Ps2 and the pressure regulator Pn2 may push the mixed chemicals in the mixing vessel 320 through a line 324 and into the site-isolated reactor portion 206 of the combinatorial processing tool 300. The mixed chemicals may flow through a valve Vf1 and into a flow cell 326. The flow cell 326 may be one portion of a site isolated reactor, and may be used to apply the mixed chemicals to a portion or portions of a substrate under processing in the site-isolated reactor portion 306 of the combinatorial processing tool 300. The flow cell 326 may be one of a series of parallel cells forming site-isolated reactors which may be configured to effect site-isolated processing on proximate regions on the substrate. Each of the flow cells may be configured to effect site isolated processing, for example, by flowing fluids (e.g., mixed chemicals) onto proximate regions on the substrate. Chemicals may be provided to the flow cell 326 and, consequently, to a substrate via the supply manifold Vd1.

In some implementations, different numbers of flow cells 326 may be operating simultaneously. For example, during one operation only one flow cell may be open, while during another, eight may be open. The variability of the number of flow cells in operation changes the flow volume demands. Using the techniques described herein, the pressure in the supply vessel 310 can be adjusted during changes in the number of flow cells operating within the combinatorial processing tool 300 to maintain fluid flow rate calibration and consistent processing across multiple regions.

Calibration of a Chemical Dispense System

As described above, the supply portion 302 of the combinatorial processing tool 300 may supply fluids (e.g., liquid chemicals) to the mixing portion 304 and the reactor portion 306 of the combinatorial processing tool 200. For example, the supply vessel 310 may supply a fluid via the supply line 314, the supply manifold Vd1, the dispense path 318 to the mixing portion 304 and the reactor portion 306 of the combinatorial processing tool 300.

In combinatorial processing tools, in order to reliably and consistently process multiple regions of a substrate, it may be desirable to control the flow rate of the chemical liquid in a particular dispense path 318 to the mixing portion 304 and/or the reactor portion 306 of the combinatorial processing tool. However, in some circumstances the flow rate of the fluid may be affected by the various impedances of each dispense path. For example, if the pressure applied to the supply vessel 310 by the pressure source Ps1 is constant and only a first valve in the supply manifold Vd1 is opened to couple the supply line to a first single flow cell 326 via a first dispense path 318, the flow rate out of the supply vessel 310 may be a first value. However, if a second valve in the supply manifold Vd1 is opened to supply fluids from the supply vessel 310 to a second single flow cell 326 via a second dispense path 318, the flow rate out of the supply vessel 310 may be a second value distinct from the first. For example, some flow paths may have different lengths, may be made of different materials, may include bends, etc. that may affect the total impedance of the flow path. Additionally, if the pressure applied to the supply vessel 310 by the pressure source Ps1 is constant, the flow rate in the supply line 314 may also change or vary based on the height of the liquid in the supply vessel 310.

Consequently, a need exists for calibrating a flow rate with respect to the applied pressure for each dispense path 318 in the combinatorial processing system. Implementations described herein provide technologies and devices for providing a specified fluid flow rate into destination vessels (e.g., mixing vessels and/or flow cells). According to one implementation, the specified fluid flow rate may be obtained by providing a specified pressure to the supply vessel containing the liquid. The pressure value required to create the specified fluid flow rate may be determined using data obtained from calibration data correlating the fluid flow rate and the corresponding pressure for each dispense path 318.

Figure 4:
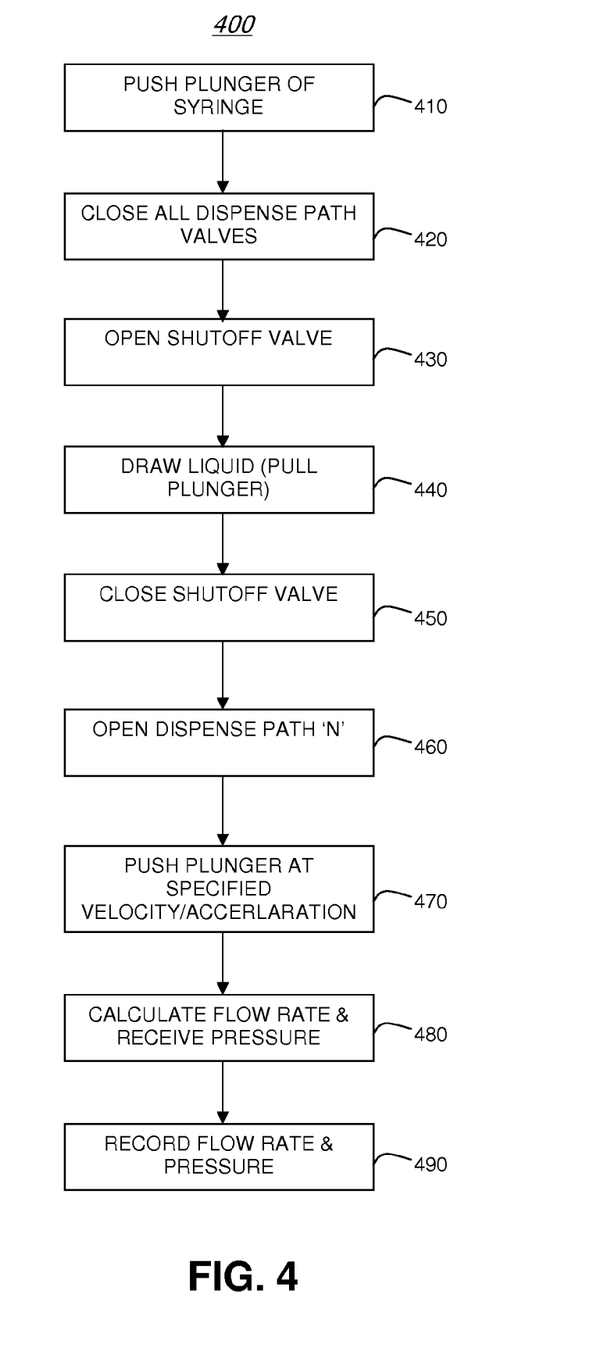
FIG. 4 illustrates a flow diagram of a method for calibrating a chemical dispense system according to implementations of various techniques described herein.

FIG. 4 illustrates a method 400 for calibrating a chemical dispense system by creating calibration data pertaining to the fluid flow rate and its corresponding pressure for each dispense path 318 in accordance with implementations of various techniques described herein. Method 400 may be executed by the controller 316 illustrated in FIG. 3.

At step 410, the controller 316 may send a command to the motor attached to the plunger of the syringe Sg to push the plunger completely into the barrel of the syringe Sg such that all of the fluid contained in the barrel may be removed.

At step 420, the controller 316 may close all of the valves in the supply manifold Vd1.

At step 430, the controller 316 may open the shutoff valve Sv to provide the syringe Sg access to the supply vessel 310 via the supply line 314.

At step 440, the controller 316 may send a command to the motor attached to the plunger to pull the plunger to draw the fluid from the supply vessel 310 to the barrel of the syringe Sg. In one implementation, the motor may pull the plunger such that the barrel or cylinder of the syringe is completely full.

At step 450, the controller 316 may close the shutoff valve Sv such that the supply line 314 may not have access to the supply vessel 310. In this manner, the fluid drawn in step 440 may be prevented from returning to the supply vessel 310. Instead, a path may be created for the fluid to flow to the supply manifold Vd1.

At step 460, the controller 316 may open a first valve of the supply manifold Vd1 such that the fluid contained in the syringe Sg may have a path to a first destination vessel via the supply line 314, the first valve of the supply manifold Vd1, and the first dispense path 318. In one implementation, the combinatorial processing tool 300 may not have the supply manifold Vd1 coupled to the supply vessel 310; instead, the supply vessel 310 may be coupled to directly to the dispense path 318.

At step 470, the controller 316 may send a command to the motor to push the plunger of the syringe Sg at a constant velocity or at an initial velocity with a constant acceleration depending on the preference of the user. In one implementation, the controller 316 may store into its memory the time in which the motor started to push the plunger and the time in which the motor completed each motor step.

At step 480, the controller 316 may calculate the flow rate of the fluid being provided to the destination vessel via supply line 314 and dispense path 318. The controller 316 may use the amount of steps that the motor has taken while pushing the plunger, the initial time in which the motor started pushing the plunger, and the times in which each motor step was taken to determine the fluid flow rate. For example, each motor step may correspond to a known volume of fluid that has been dispensed into the chemical dispense system. The controller 316 may then determine the amount of time that has elapsed between each motor step. Using the volume of the fluid dispensed and the time elapsed during a motor step, the controller 316 may determine the fluid flow rate after each motor step. Although the controller 316 has been described to determine the fluid flow rate based on the volume dispensed and the time elapsed during a single motor step, it should be noted that the volume of fluid dispensed and time elapsed may also be determined for other motor step increments such as ½, ⅔, ¾, multiple motor steps, or the like.

Referring back to step 480, the controller 316 may also record the pressure value from the pressure indicator Pd at the time in which each motor step was completed.

At step 490, the controller 316 may make a correlation between each calculated flow rate and its corresponding pressure. For example, the correlation can be used to determine a flow rate based on a measured pressure (see FIG. 5). In one implementation, if the controller 316 sent a command to the motor to push the plunger at a constant velocity, the flow rate and pressure correlations may remain relatively the same for each motor step. If the controller 316 sent a command to the motor to push the plunger at an initial velocity with a constant acceleration, the flow rate and pressure value correlation may change for each motor step, and thus provide a wide range of calibration data pertaining to the various pressures and corresponding flow rates of a dispense path. The controller 316 may store the correlation into a memory as calibration data for the first destination path 318. In one implementation, steps 410-490 may be repeated for each destination path 318 to create specific calibration data pertaining to each destination path 318. The steps 410-490 may also be repeated at different velocities for each dispense path 318.

Providing a Specific Volume to a Destination Vessel

Figure 5:
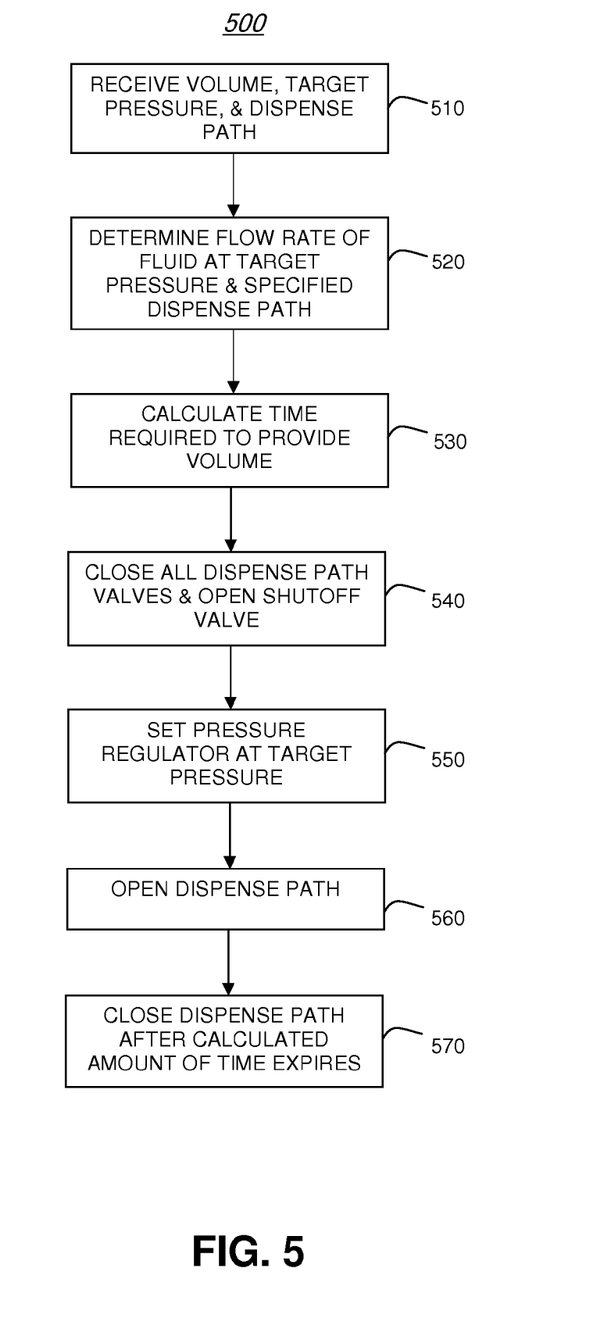
FIG. 5 illustrates a flow diagram of a method for providing a chemical dispense system with a predetermined volume of a fluid according to implementations of various techniques described herein.

FIG. 5 illustrates a method 500 for providing a specific volume of a fluid to a destination vessel in a chemical dispense system in accordance with implementations of various techniques described herein. Method 500 may be executed by the controller 316 illustrated in FIG. 3. In performing method 500, the controller 316 may require calibration data pertaining to the fluid flow rate and pressure correlations for each dispense path of the chemical dispense system as recorded by method 400. For example, the method 500 can be used in implementing combinatorial processing to deliver fluids to a reactor in a consistent, repeatable manner (e.g., accurate flow rate, volume, and pressure).

At step 510, the controller 316 may receive a volume of a fluid, a target pressure, and a dispense path 318 from a user.

At step 520, the controller 316 may use the calibration data obtained from method 400 to determine the fluid flow rate that corresponds to the target pressure value and the specific dispense path 318 received from the user.

At step 530, the controller 316 may calculate the time required to provide the predetermined volume of the fluid to a destination vessel via the specified dispense path 318 based on the corresponding flow rate. For example, the calibration data may indicate that dispense path 'N' may have a 3 milliliter per second fluid flow rate at the target pressure specified by the user. If the volume specified by the user was 6 milliliters, the controller 316 may determine that 2 seconds may be required to provide the predetermined volume of the fluid to the destination vessel via the specified dispense path 318.

At step 540, the controller 316 may close all of the valves at the supply manifold Vd1 and open the shutoff valve Sy.

At step 550, the controller 316 may send a command to the pressure regulator Pn1 to regulate the pressure from the pressure source Ps1 such that the target pressure may be applied to the supply line 314.

At step 560, the controller 316 may open one valve of the supply manifold Vd1 coupled to the dispense path 318 specified by the user at step 510. In one implementation, the controller 316 may start a timer at the instant the valve is opened to measure the time in which the fluid may be flowing into its destination vessel.

At step 570, the controller 316 may close the valve of the supply manifold Vd1 coupled to the specified dispense path 318 after the calculated time to provide the predetermined volume of the fluid to a destination vessel has expired. In one implementation, the controller 316 may compare the calculated time to the timer initiated when the valve may have been opened. When the calculated time equals the time indicated on the timer, the controller 216 may close the valve at the supply manifold Vd1.

Figure 6:
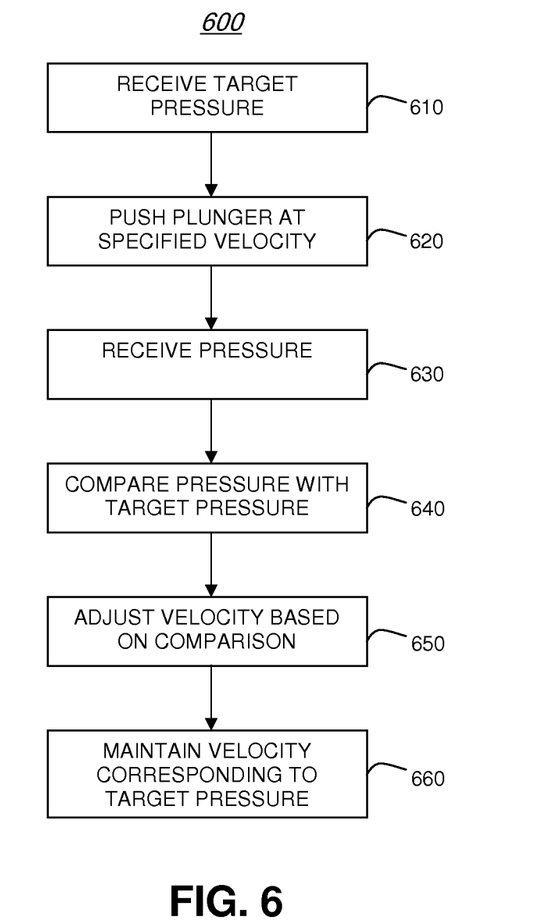
FIG. 6 illustrates a flow diagram of a method for providing a fluid to a chemical dispense system at a predetermined pressure according to implementations of various techniques described herein.

It should be noted that correction factors may be built into each method described in FIGS. 4-6 to account for certain sources of errors. In one implementation, when the syringe is accelerated, the pressure versus flow rate curve shifts. The correction factor may be extracted, in a simple method by obtaining pressure versus flow rate curves for different accelerations. The pressure versus flow rate curves may be used to extrapolate to the case of zero acceleration to obtain the true flow rate versus pressure curve.

Although FIG. 5 illustrates a method 500 for providing a specific volume of a fluid to a destination vessel in a chemical dispense system, it should be noted that the method 500 may also be used to provide a destination vessel a fluid at a specified flow rate. In one implementation, the controller 316 may receive a request to provide a destination vessel a fluid at a specified flow rate via a specified dispense path.

The controller 316 may then use the calibration data obtained from method 400 to determine the pressure value that corresponds to the specified flow rate of the fluid and the specific dispense path 318 received from the user (step 520).

After determining the pressure value that corresponds to the specified flow rate of the fluid and the specific dispense path 318 received from the user, the controller 316 may then conduct steps 540-570 in the same manner as described above. However, at step 570, the controller 316 may close the valve of the supply manifold Vd1 coupled to the specified dispense path 318 after a specified amount of time has elapsed as opposed to a calculated amount of time to fill a destination vessel with a specified volume.

Controlling Pressure with a Dispenser

FIG. 6 illustrates a method 600 for controlling the pressure of the fluid in the supply line 314 with the syringe Sg in a chemical dispense system in accordance with implementations of various techniques described herein. Method 600 may be executed by the controller 316 illustrated in FIG. 3. The method 600 in one embodiment is a feedback system that measures a pressure in a flow line and adjusts the flow rate (by adjusting, e.g., the velocity of the syringe plunger) to achieve a desired pressure of fluid delivery into a flow cell.

At step 610, the controller 316 may receive a target pressure from a user such that a fluid may be delivered into the supply line 314. In one implementation, the controller 316 may open one valve of the supply manifold Vd1 and close the shutoff valve Sv such that the syringe Sg may be coupled to a destination vessel via a destination path 318.

At step 620, the controller 316 may send a command to the motor attached to the plunger of the syringe Sg containing the fluid to push the plunger at an initial velocity.

At step 630, the controller 316 may receive a pressure value from the pressure indicator Pd.

At step 640, the controller 316 may compare the received pressure value with the target pressure value received by the controller at step 610.

At step 650, the controller 316 may adjust the velocity at which the controller 216 is pushing the plunger of the syringe Sg such that the pressure on the supply line changes to match the target pressure. In one implementation, if the measured pressure value is less than the target pressure, the controller 316 may send a signal to the motor coupled to the plunger of the syringe Sg to increase the velocity in which the motor is pushing the plunger. Conversely, if the measured pressure value is greater than the target pressure, the controller 316 may send a signal to the motor coupled to the plunger of the syringe Sg to decrease the velocity in which the motor is pushing the plunger.

At step 660, the controller 316 may maintain the velocity at which it pushes the plunger of the syringe Sg after determining the velocity that corresponds to the target pressure.

While the foregoing is directed to implementations of various technologies described herein, other and further implementations may be devised without departing from the basic scope thereof, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method of dispensing a specified volume of a fluid into a destination vessel, the method comprising:
   determining a flow rate in a supply line corresponding to a target pressure;
   wherein determining the flow rate that corresponds to the target pressure comprises:
   retrieving calibration data on a plurality of calibration pressures and corresponding calibration flow rates for a dispense path coupled to the destination vessel; and
   wherein the calibration data is generated by a process comprising:
   pushing a plunger in a dispenser to dispense a fluid into the supply line;
   measuring a resulting calibration pressure in the supply line;
   computing a corresponding calibration flow rate from a volume of the fluid dispensed into the supply line and a time elapsed in dispensing the fluid;
   recording the resulting calibration pressure and the corresponding calibration flow rate;
   calculating the flow rate corresponding to the target pressure from the calibration data;
   calculating an amount of time required to dispense the specified volume of the fluid at the flow rate; and
   dispensing the fluid at the target pressure through the supply line to the destination vessel for the amount of time.

2. The method of claim 1, wherein the dispense path is coupled directly to the supply line.

3. The method of claim 1, wherein the dispense path is coupled to the supply line through a supply manifold.

4. The method of claim 1, further comprising:
   opening a valve to allow fluid flow through the dispense path; and
   closing the valve after the amount of time expires.

5. The method of claim 4, wherein the valve is a multi-way valve.

6. The method of claim 4, wherein the valve is opened and closed by a controller.

7. The method of claim 1, wherein the plunger is pushed by a motor.

8. The method of claim 1, wherein the plunger is pushed at a constant velocity.

9. The method of claim 1, wherein the plunger is pushed with a constant acceleration.

10. The method of claim 1, wherein the dispensing of the fluid volume comprises setting a pressure regulator to the target pressure; wherein the pressure regulator is coupled to a supply vessel containing a dispensed fluid; and wherein the supply vessel is coupled to the supply line.

11. The method of claim 10, wherein the pressure regulator provides a pressurized gas to the supply vessel at a regulated pressure; and wherein the pressurized gas pushes fluid out of the supply vessel into the supply line.

12. The method of claim 10, further comprising:
    measuring a pressure at the supply line;
    comparing the measured pressure with the target pressure; and
    adjusting the pressure regulator based on the comparison.

13. The method of claim 10, further comprising using a controller to adjust the regulated pressure from the pressure regulator.

* * * * *